United States Patent
Matsui et al.

(10) Patent No.: US 8,773,825 B2
(45) Date of Patent: Jul. 8, 2014

(54) SEMICONDUCTOR INTEGRATED CIRCUIT DEVICE

(75) Inventors: Tooru Matsui, Osaka (JP); Masanori Hirofuji, Osaka (JP); Yoshifumi Kumashiro, Osaka (JP); Tatsuya Naruse, Osaka (JP); Hiroaki Segawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/550,318

(22) Filed: Jul. 16, 2012

(65) Prior Publication Data

US 2012/0287541 A1 Nov. 15, 2012

Related U.S. Application Data

(63) Continuation-in-part of application No. PCT/JP2010/007390, filed on Dec. 21, 2010.

(30) Foreign Application Priority Data

Feb. 22, 2010 (JP) ................................. 2010-036599

(51) Int. Cl.
*H02H 9/00* (2006.01)
(52) U.S. Cl.
USPC .......................................................... 361/56
(58) Field of Classification Search
USPC .......................................................... 361/56
See application file for complete search history.

(56) References Cited

U.S. PATENT DOCUMENTS

| | | | |
|---|---|---|---|
| 2001/0015447 | A1 | 8/2001 | Shinomiya |
| 2004/0012065 | A1 | 1/2004 | Shiina |
| 2005/0218432 | A1 | 10/2005 | Matsuzaki et al. |
| 2007/0145565 | A1 | 6/2007 | Miyata et al. |
| 2008/0173899 | A1 | 7/2008 | Takakuwa et al. |

FOREIGN PATENT DOCUMENTS

| | | |
|---|---|---|
| JP | 05-218204 | 8/1993 |
| JP | 06-350082 | 12/1994 |
| JP | 2001-237317 | 8/2001 |
| JP | 2007-042718 A | 2/2007 |

OTHER PUBLICATIONS

Chad Marak and Jim Colby, "Tips for Enhancing ESD protection," Littlefuse, Chicago, IL Application Note, 2009.*
International Search Report issued in International Patent Application No. PCT/JP2010/007390, mailed Jan. 25, 2011.

* cited by examiner

*Primary Examiner* — Scott Bauer
(74) *Attorney, Agent, or Firm* — McDermott Will & Emery LLP

(57) ABSTRACT

An electrode pad is provided above a circuit block of a semiconductor integrated circuit device. A junction point A and a junction point B are provided on connection lines connecting electrode pads to an internal circuit and an electrostatic discharge (ESD) protection circuit. The junction point A and the junction point B are positioned at locations closer to the ESD protection circuit than to the electrode pads.

6 Claims, 7 Drawing Sheets

SEMICONDUCTOR INTEGRATED CIRCUIT DEVICE

CROSS-REFERENCE TO RELATED APPLICATION

This is a continuation of PCT International Application PCT/JP2010/007390 filed on Dec. 21, 2010, which claims priority to Japanese Patent Application No. 2010-036599 filed on Feb. 22, 2010. The disclosures of these applications including the specifications, the drawings, and the claims are hereby incorporated by reference in their entirety.

BACKGROUND

The present disclosure relates to semiconductor integrated circuit devices, particularly relates to a configuration connecting an internal circuit, an electrode pad formed above a circuit block, and an ESD protection circuit which protects the internal circuit from damage due to electrostatic discharge (ESD).

In recent years, with higher integration of circuits, the number of pins of the semiconductor integrated circuit devices is increasing. To correspond to such an increase in the number of pins, a technique of arranging electrode pads in a matrix is suggested in, for example, Japanese Patent Publication No. H05-218204.

In general, an ESD protection circuit is positioned below an electrode pad. Thus, if many electrode pads are positioned above the circuit block, the ESD protection circuits may obstruct the circuit configuration in the circuit block, and this may result in problems, such as an increase in circuit area and high density of lines.

To solve the above problems, Japanese Patent Publication No. 2001-237317, for example, discloses a structure in which the ESD protection circuit is not positioned below the electrode pad, but is positioned at a periphery of a semiconductor integrated circuit device.

SUMMARY

In general, an input/output circuit connected to an electrode pad is positioned under the electrode pad. Thus, if the ESD protection circuit is positioned at the periphery of the semiconductor integrated circuit device as in Japanese Patent Publication No. 2001-237317, it does not obstruct the circuit configuration, but the length of the line for electrically connecting the electrode pad and the ESD protection circuit may be increased. As a result, a problem in which a surge current does not sufficiently flow in the ESD protection circuit, and the input/output circuit is easily damaged, may be caused.

According to one aspect of the present disclosure, a semiconductor integrated circuit device includes: a circuit block having an internal circuit which is an input circuit, an output circuit, or an input/output circuit; an electrode pad provided above the circuit block, and electrically connected to the internal circuit; and an electrostatic discharge (ESD) protection circuit electrically connected to the electrode pad, wherein a junction point is provided at a connection line connecting the electrode pad to the internal circuit and the ESD protection circuit; the connection line includes a first line connecting the electrode pad and the junction point, a second line connecting the junction point and the internal circuit, and a third line connecting the junction point and the ESD protection circuit; and the junction point is positioned at a location which is closer to the ESD protection circuit than to the electrode pad.

According to this aspect of the present disclosure, of the connection line connecting the electrode pad to the internal circuit and the ESD protection circuit, the first line connecting the electrode pad and the junction point is a shared line for connecting the electrode pad and the internal circuit, and for connecting the electrode pad and the ESD protection circuit. Since the junction point is positioned at a location closer to the ESD protection circuit than to the electrode pad, a resistance value of the third line connecting the junction point and the ESD protection circuit is small. Thus, a surge current applied to the electrode pad can easily flow in the ESD protection circuit. As a result, it is possible to prevent damage of the internal circuit.

In a semiconductor integrated circuit device according to the present disclosure in which an electrode pad is positioned above a circuit block, a surge current applied to the electrode pad can easily flow in an ESD protection circuit, and therefore, it is possible to prevent damage of an internal circuit.

DETAILED DESCRIPTION

Embodiments of the present disclosure will be described in detail below based on the drawings.

First Embodiment

Figure 1:
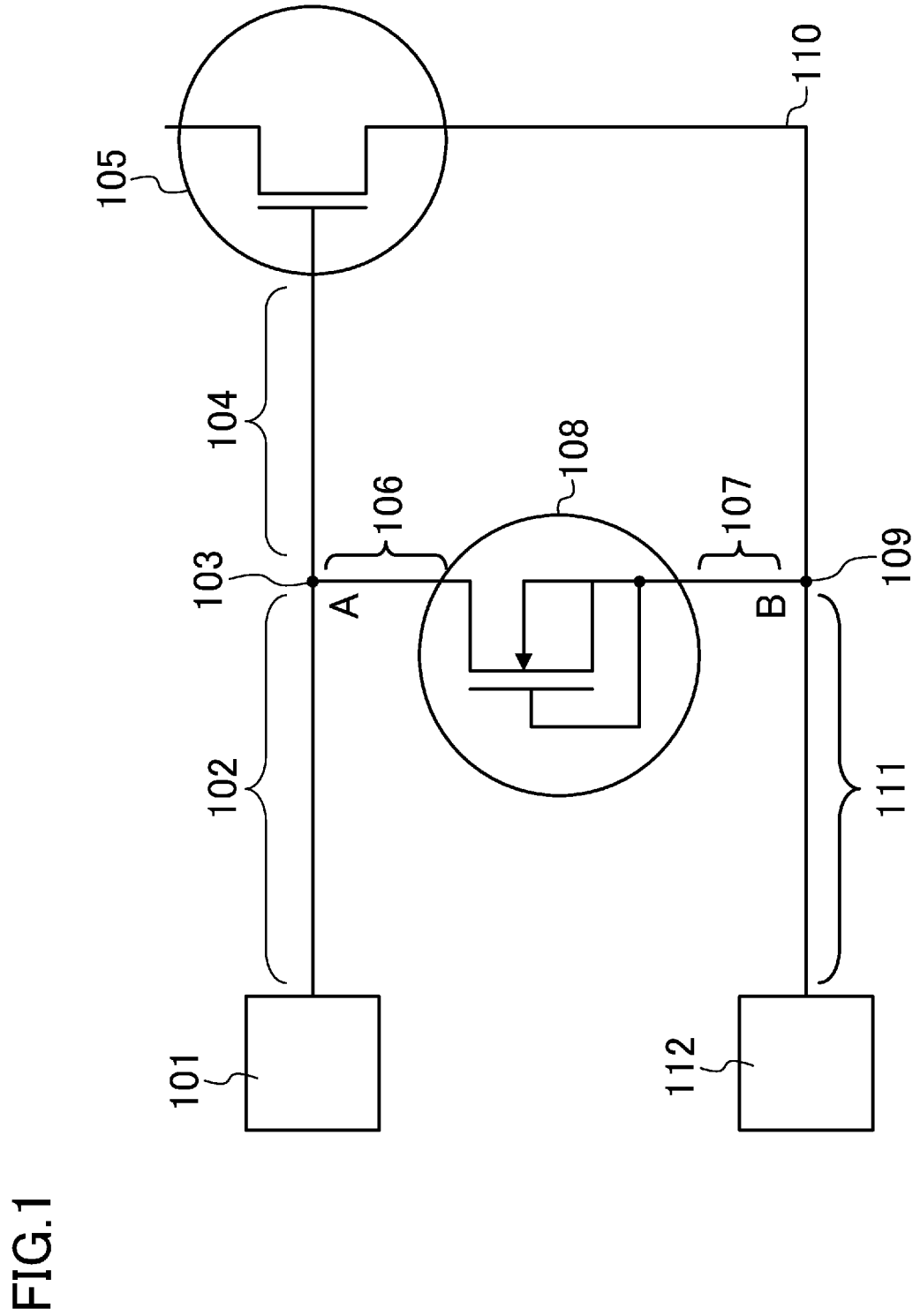
FIG. 1 is a circuit diagram which schematically shows a configuration of a semiconductor integrated circuit device according to the first embodiment.

FIG. 1 is a circuit diagram which schematically shows a configuration of a semiconductor integrated circuit device according to the first embodiment. The semiconductor integrated circuit device according to the present embodiment includes a circuit block in which an input circuit 105 as an internal circuit is provided, an electrode pad 101 and a GND electrode pad 112 which are provided above the circuit block and are electrically connected to the input circuit 105, and an ESD protection circuit 108 which is electrically connected to the electrode pad 101 and the GND electrode pad 112 to protect the circuit block from damage due to electrostatic discharge (ESD). In the configuration in FIG. 1, the ESD protection circuit 108 is comprised of an N type MOS transistor.

A junction point A103 is provided on a connection line connecting the electrode pad 101 to the input circuit 105 and the ESD protection circuit 108. A junction point B109 is provided on a connection line connecting the GND electrode pad 112 to the input circuit 105 and the ESD protection circuit 108.

Specifically, the electrode pad 101 and a drain region of the ESD protection circuit 108 comprised of the N type MOS transistor are connected to each other by a line 102 as a first line connecting the electrode pad 101 and the junction point A103, and a line 106 as a third line connecting the junction point A103 and the ESD protection circuit 108. The GND electrode pad 112 and a source region of the ESD protection circuit 108 are connected to each other by a line 111 as a first line connecting the GND electrode pad 112 and the junction point B109, and a line 107 as a third line connecting the junction point B109 and the ESD protection circuit 108.

A gate of the input circuit 105 is connected to the electrode pad 101 by the line 102 connecting the electrode pad 101 and the junction point A103, and a line 104 as a second line connecting the junction point A103 and the input circuit 105. A source region of the input circuit 105 is connected to the GND electrode pad 112 by the line 111 connecting the GND electrode pad 112 and the junction point B109, and a line 110 as a second line connecting the junction point B109 and the input circuit 105.

The junction point A103 is positioned at a location closer to the ESD protection circuit 108 than to the electrode pad 101. The junction point B109 is positioned at a location closer to the ESD protection circuit 108 than to the GND electrode pad 112.

Figure 2:
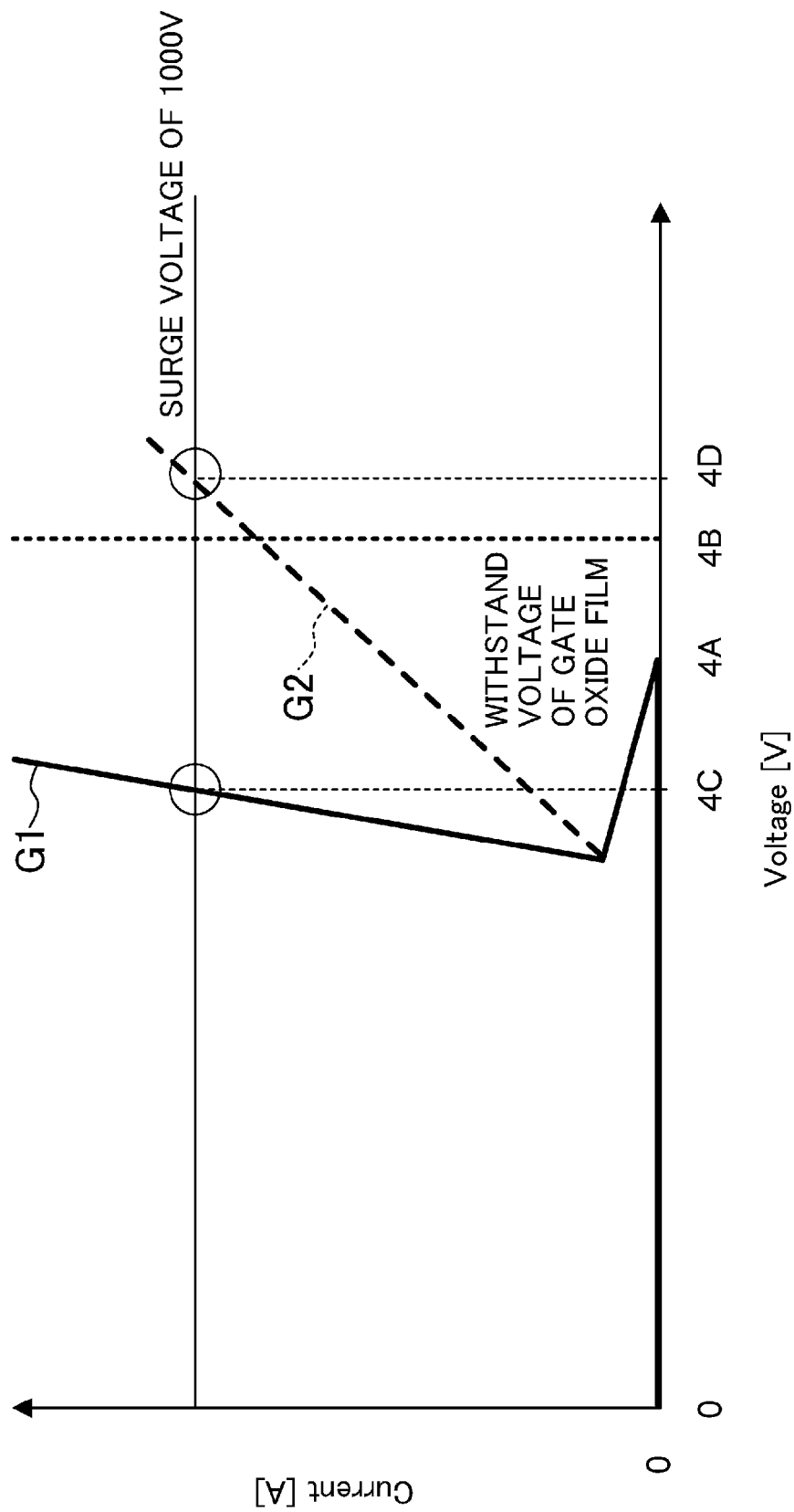
FIG. 2 is a graph which shows properties of an ESD protection circuit.

FIG. 2 is a graph which shows properties of the ESD protection circuit 108. In FIG. 2, voltages (hereinafter referred to as internal voltages) applied to the ESD protection circuit 108 and the input circuit 105 when a surge voltage is applied to the electrode pad 101 is represented by X axis, and a current which flows at the voltage application is represented by Y axis.

As shown in FIG. 2, in the case where a surge voltage is applied to the electrode pad 101, the ESD protection circuit 108 is turned on when the internal voltage is increased to "4A" voltage, and a current abruptly flows in the ESD protection circuit 108 due to breakdown characteristics. The characteristics of the current which flows in the ESD protection circuit 108 depend on a sum of resistance values (hereinafter referred to as ESD protection resistance values) of the lines 106, 107, i.e., the lines from the junction point A103 and the junction point B109 to the ESD protection circuit 108. In the present embodiment, the upper limit of the ESD protection resistance value which needs to be satisfied is called a reference resistance value.

Now, the lines whose resistances are calculated as the ESD protection resistance value will be described.

The lines 102, 111 are shared lines for connecting the electrode pad 101 and the GND electrode pad 112 to the input circuit 105 and to the ESD protection circuit 108. Thus, it is clear that these lines can be omitted from consideration.

The lines 104, 110 can be considered as follows. That is, the size of the transistor of the ESD protection circuit 108 is adjusted, in general, such that an operating voltage (which is almost the same as an internal voltage) at the time of application of a reference surge voltage is less than a withstand voltage of a gate oxide film of the input circuit 105 as long as the ESD protection resistance value is equal to or less than a reference resistance value. Thus, even if the resistance values of the lines 104, 110 are 0Ω, the input circuit 105 is not damaged by the application of the reference surge voltage as long as the ESD protection resistance value is equal to or less than the reference resistance value. For this reason, the lines 104, 110 can also be omitted from consideration.

In FIG. 2, the inclination G1 represents the characteristics of a current flowing in the ESD protection circuit 108 when the ESD protection resistance value is smaller than the reference resistance value. In the case represented by the inclination G1, the internal voltage at the time of application of a surge voltage of 1000 V, for example, is "4C" voltage, which is lower than "4B" voltage, i.e., the withstand voltage of the input circuit 105. Thus, the input circuit 105 is not damaged. On the other hand, the inclination G2 represents the current characteristics when the ESD protection resistance value is larger than the reference resistance value. In the case represented by the inclination G2, the internal voltage at the time of application of a surge voltage of 1000 V is "4D" voltage, which is larger than "4B" voltage, i.e., the withstand voltage of the gate oxide film. Thus, the input circuit 105 is damaged. Here, the surge voltage of 1000 V is applied as an example. However, the allowable surge voltage may be increased because the smaller the ESD protection resistance value, the more current flows in the ESD protection circuit 108.

Specifically, the resistance values of the lines 102, 111 can be omitted from the calculation of the ESD protection resistance value by providing the junction point A103 and the junction point B109 as shown in FIG. 1. Further, the lengths of the lines 106, 107, that is, the lengths from the junction point A103 and the junction point B109 to the ESD protection circuit 108, are reduced by positioning the junction point A103 and the junction point B109 at the locations closer to the ESD protection circuit 108 than to the electrode pad 101 and the GND electrode pad 112. As a result, the ESD protection resistance value can be reduced, and the allowable surge voltage is increased.

As described above, according to the present embodiment, the first line connecting the electrode pad and the junction point, the second line connecting the junction point and the input circuit, and the third line connecting the junction point and the ESD protection circuit, are provided to position the junction point at a location closer to the ESD protection circuit than to the electrode pad. As a result, the ESD protection resistance value is reduced, and thus, easily satisfies the reference resistance value. Moreover, the allowable surge voltage is further increased.

Further, the smaller the resistance values of the lines 106, 107, the more current flows in the ESD protection circuit 108 at the application of the surge voltage. In contrast, the larger the resistance values of the lines 104, 110, the lower voltage is applied to the input circuit 105. Thus, the allowable surge voltage is further increased. That is, according to the present embodiment, the allowable surge voltage can be further increased by satisfying the following relationship, that is, a resistance value of the line from the junction point to the input circuit>a resistance value of the line from the junction point to the ESD protection circuit (a resistance value of the second line>a resistance value of the third line). In general, the length of the line and the resistance value are proportional to each other. Thus, if the following relationship, that is, the length of the line from the junction point to the input circuit>the length of the line from the junction point to the ESD protection circuit (the length of the second line>the length of the third line), is satisfied, the allowable surge voltage is further increased without a need to check the resistance value.

Second Embodiment

Figure 3:
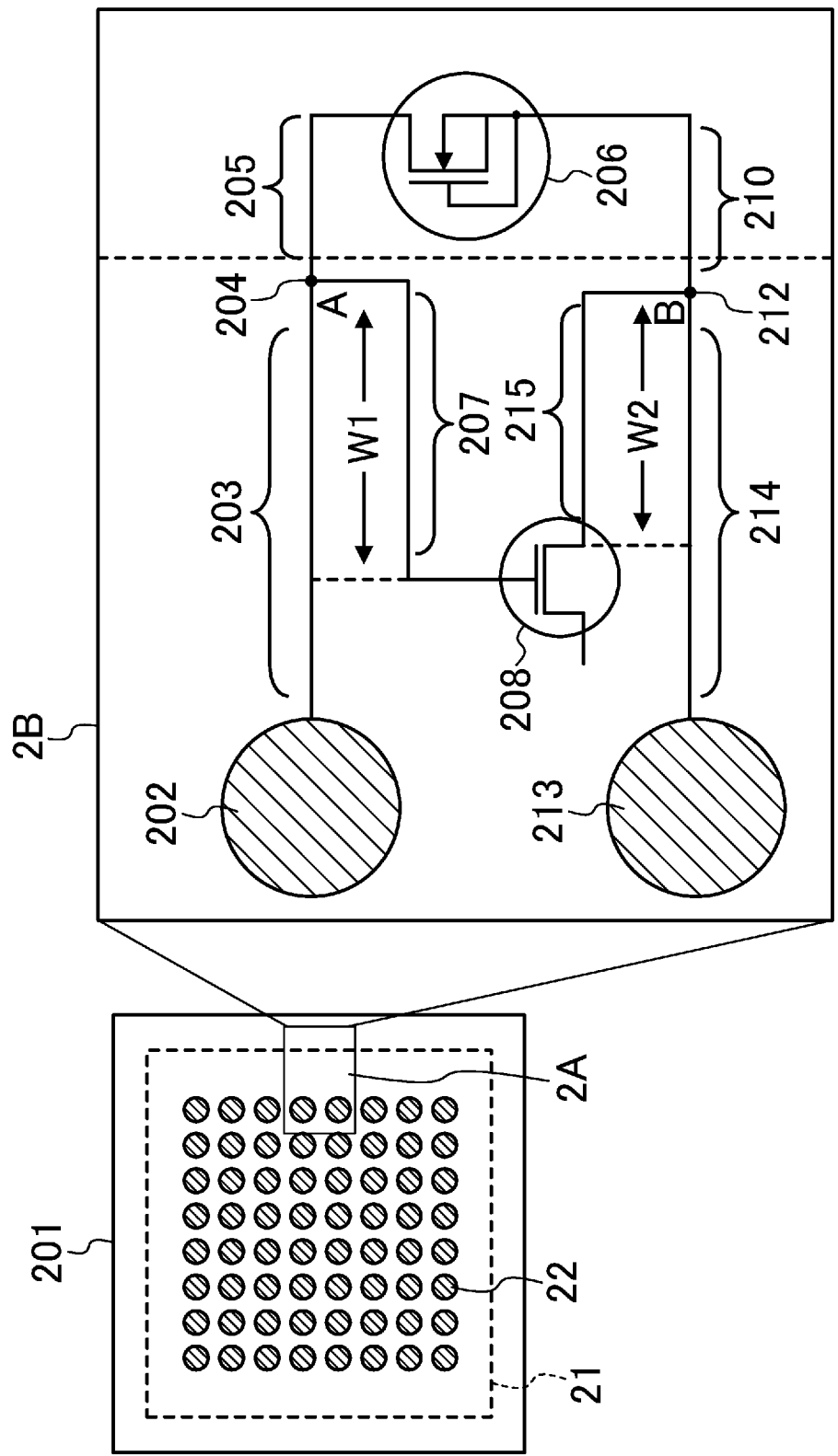
FIG. 3 shows a configuration of a semiconductor integrated circuit device according to the second embodiment.

FIG. 3 shows a configuration of a semiconductor integrated circuit device according to the second embodiment. In the semiconductor integrated circuit device 201 shown in FIG. 3, electrode pads 22 are arranged above a circuit block 21. The reference character 2B is an enlarged view of the area 2A. As shown in the enlarged view 2B, an ESD protection circuit 206 is positioned closer to the periphery of the semiconductor integrated circuit device 201 than an electrode pad 202, a GND electrode pad 213, and an input circuit 208. A junction point A204 is provided on a connection line connecting the electrode pad 202 to the input circuit 208 and the ESD protection circuit 206. A junction point B212 is provided on a connection line connecting the GND electrode pad 213 to the input circuit 208 and the ESD protection circuit 206.

Specifically, the electrode pad 202 and a drain region of the ESD protection circuit 206 comprised of an N type MOS transistor are connected to each other by a line 203 as a first line connecting the electrode pad 202 and the junction point A204, and a line 205 as a third line connecting the junction point A204 and the ESD protection circuit 206. The GND electrode pad 213 and a source region of the ESD protection circuit 206 are connected to each other by a line 214 as a first line connecting the GND electrode pad 213 and the junction point B212, and a line 210 as a third line connecting the junction point B212 and the ESD protection circuit 206.

A gate of the input circuit 208 is connected to the electrode pad 202 by the line 203 connecting the electrode pad 202 and the junction point A204, and a line 207 as a second line connecting the junction point A204 and the input circuit 208. A source region of the input circuit 208 is connected to the GND electrode pad 213 by the line 214 connecting the GND electrode pad 213 and the junction point B212, and a line 215 as a second line connecting the junction point B212 and the input circuit 208.

The junction point A204 and the junction point B212 are positioned at locations between the ESD protection circuit 206 and the input circuit 208. The junction point A204 and the junction point B212 are positioned at locations close to the periphery of the semiconductor integrated circuit device 201, that is, closer to the ESD protection circuit 206 than the input circuit 208. In this structure, routing of the lines 207, 215 along the lengths W1, W2 is necessary. However, the lines 205, 210 connecting the junction point A204 and the junction point B212 to the ESD protection circuit 206 can be shorter, compared to the case in which the electrode pad 202 and the GND electrode pad 213 are connected to the input circuit 208 by the shortest lines. As a result, the resistances of the lines 205, 210 can be reduced by the resistances of the lengths W1, W2, and the ESD protection resistance value can be reduced.

As described above, according to the present embodiment, the first line connecting the electrode pad and the junction point, the second line connecting the junction point and the input circuit, and the third line connecting the junction point and the ESD protection circuit, are provided to position the ESD protection circuit at the periphery of the semiconductor integrated circuit device, provide the junction point at a location between the input circuit and the ESD protection circuit, and provide routing of the second line, thereby making it possible to reduce the ESD protection resistance value.

Further, in FIG. 3, the lines whose resistances are calculated as the ESD protection resistance value are the lines 205, 210. In FIG. 3, among the electrode pads of the semiconductor integrated circuit device 201, an outermost electrode pad is used as the GND electrode pad 213 to which the ESD protection circuit 206 is connected. The outermost electrode pad is closest to the periphery of the semiconductor integrated circuit device 201, and therefore, the lines 210, 214 can be shorter compared to the case in which an electrode pad which is not an outermost electrode pad is used as the GND electrode pad 213. As a result, it is possible not only to reduce the ESD protection resistance value, but also to prevent high density of the lines in the semiconductor integrated circuit device 201.

Additional descriptions about the "outermost electrode pad" described above will be provided using FIG. 4.

Figure 4:
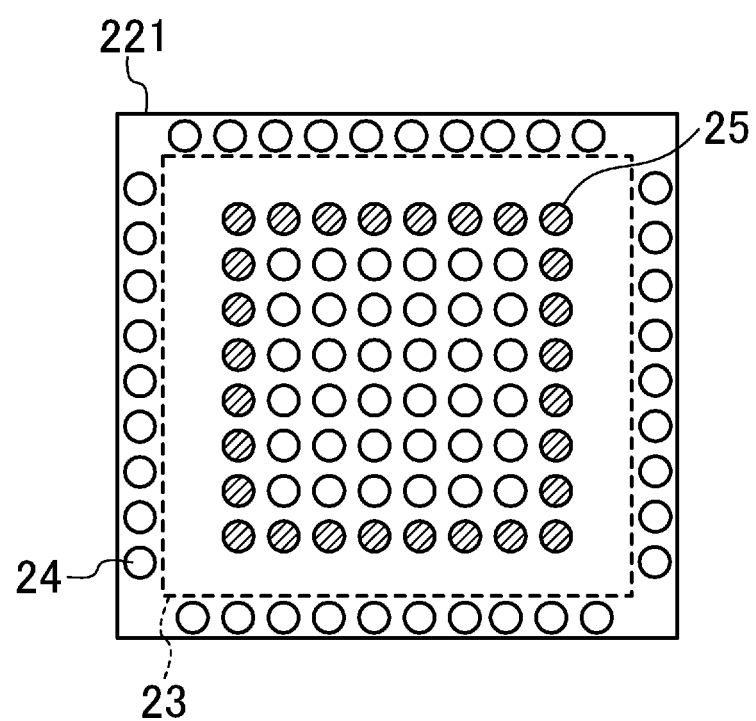
FIG. 4 is a diagram for explaining an outermost electrode pad.

In FIG. 4, among the electrode pads arranged above the semiconductor integrated circuit device 221, an electrode pad to which the ESD protection circuit is connected is an electrode pad 25 located above a circuit block 23. An electrode pad 24 located at the periphery of the semiconductor integrated circuit device 221 is an electrode pad dedicated to testing, which is used only for testing. Thus, in general, the ESD protection circuit is not connected to the electrode pad 24. The term "outermost electrode pad" as used herein refers to an outermost electrode pad among the electrode pads arranged above the circuit block.

The electrode pads 22 are arranged in a matrix in FIG. 3, but do not necessarily have to be arranged in a perfect matrix. For example, some of the electrode pads 22 may not be aligned or may be omitted.

Third Embodiment

Figure 5:
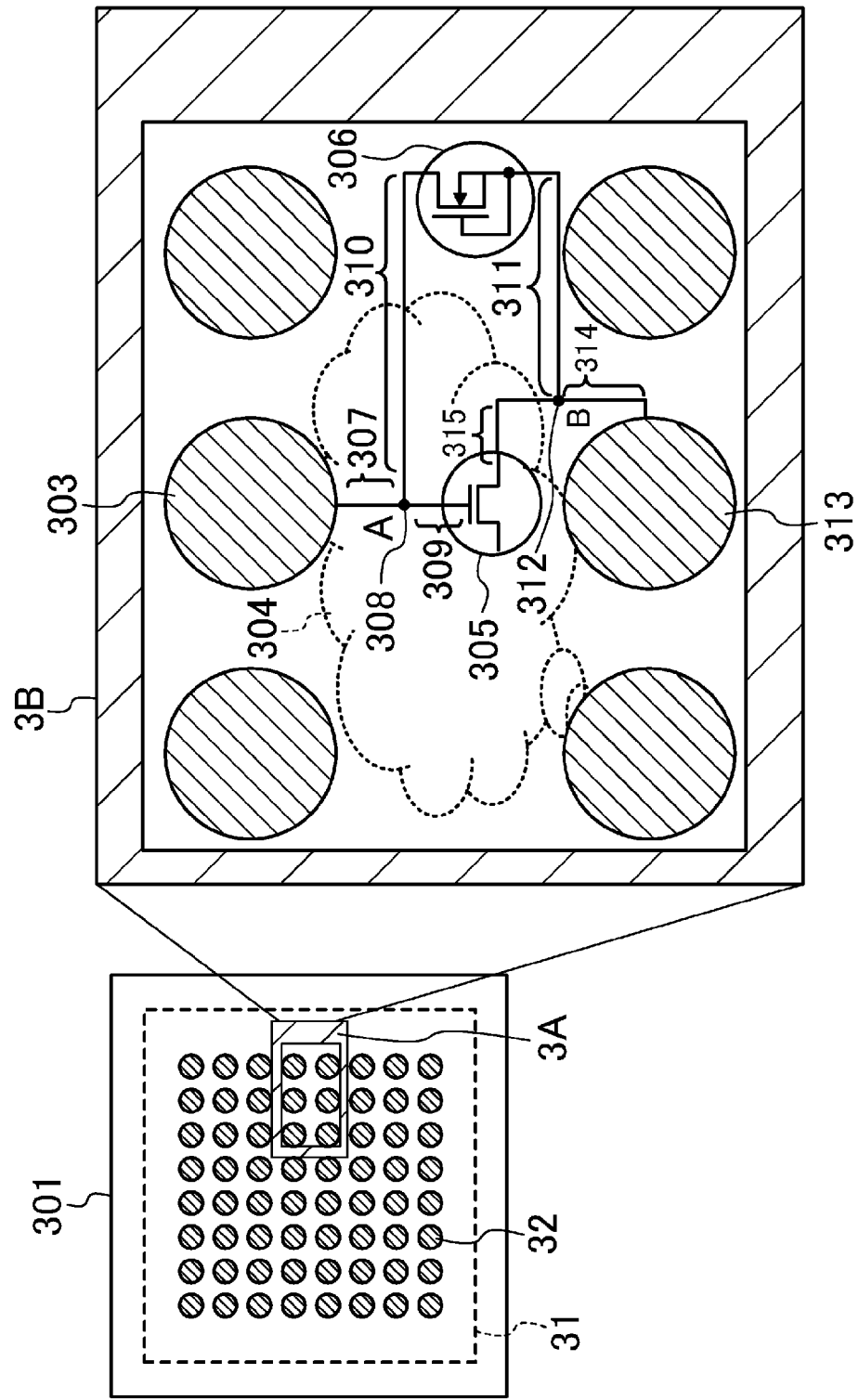
FIG. 5 shows a configuration of a semiconductor integrated circuit device according to the third embodiment.

FIG. 5 shows a configuration of a semiconductor integrated circuit device according to the third embodiment. In the semiconductor integrated circuit device 301 shown in FIG. 5, electrode pads 32 are arranged above a circuit block 31. The reference character 3B is an enlarged view of the area 3A. As shown in the enlarged view 3B, an ESD protection circuit 306 is positioned at a location in a circuit block 31 that is different from an internal circuit area 304 in which an input circuit 305 is provided. A junction point A308 is provided on a connection line connecting an electrode pad 303 to the input circuit 305 and the ESD protection circuit 306. A junction point B312 is provided on a connection line connecting a GND electrode pad 313 to the input circuit 305 and the ESD protection circuit 306.

Specifically, the electrode pad 303 and a drain region of the ESD protection circuit 306 comprised of an N type MOS transistor are connected to each other by a line 307 as a first line connecting the electrode pad 303 and the junction point A308, and a line 310 as a third line connecting the junction point A308 and the ESD protection circuit 306. The GND electrode pad 313 and a source region of the ESD protection circuit 306 are connected to each other by a line 314 as a first line connecting the GND electrode pad 313 and the junction point B312, and a line 311 as a third line connecting the junction point B312 and the ESD protection circuit 306.

A gate of the input circuit 305 is connected to the electrode pad 303 by the line 307 connecting the electrode pad 303 and the junction point A308, and a line 309 as a second line connecting the junction point A308 and the input circuit 305. A source region of the input circuit 305 is connected to the GND electrode pad 313 by the line 314 connecting the GND electrode pad 313 and the junction point B312, and a line 315 as a second line connecting the junction point B312 and the input circuit 305.

The ESD protection circuit 306 is positioned in the circuit block 31 in which the input circuit 305 is also positioned, but in a location which is different from the internal circuit area 304 where the input circuit 305 is provided, as shown in FIG. 5. In this structure, the ESD protection circuit 306 can be positioned close to the junction point A308 and the junction point B312, without obstructing the configuration and the lines of an internal circuit in the circuit block 31. Further, the ESD protection circuit 306 can be positioned closer to the electrode pad 303 and the GND electrode pad 313, compared to the case in which the ESD protection circuit is positioned at the periphery of the semiconductor integrated circuit device. As a result, the routing of the lines 310, 311 can be reduced, and therefore, the ESD protection resistance value can be reduced. The allowable surge voltage is further increased.

As described above, according to the present embodiment, the first line connecting the electrode pad and the junction point, the second line connecting the junction point and the input circuit, and the third line connecting the junction point and the ESD protection circuit, are provided to position the ESD protection circuit in the circuit block. In this structure, the third line can be provided in the circuit block, and thus, it is possible to reduce the length of the line, compared to the case in which the ESD protection circuit is positioned at the periphery of the semiconductor integrated circuit device. As a result, the ESD protection resistance value can be reduced.

Moreover, in general, internal circuits are densely provided near a central portion of the circuit block 31, whereas the internal circuits are less densely provided near the frame of the circuit block 31. Thus, in the present embodiment, it is preferable to position the ESD protection circuit 306 at a location in the circuit block 31 which is closer to an outside than the internal circuit area 304. As a result, the ESD protection circuit 306 is not likely to obstruct the internal circuit.

Figure 6:
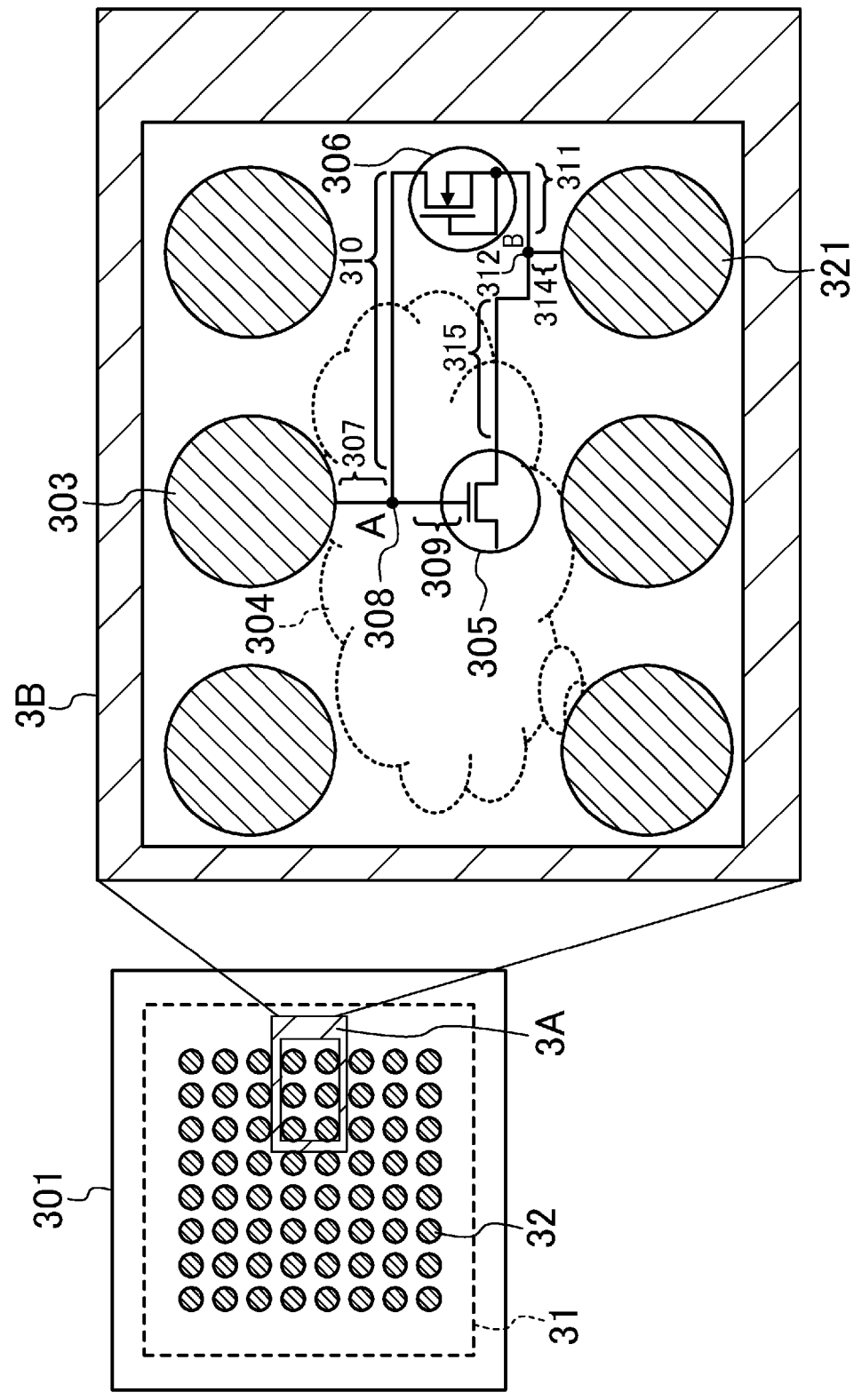
FIG. 6 shows a configuration of a semiconductor integrated circuit device according to a variation of the third embodiment.

FIG. 6 shows a configuration of a semiconductor integrated circuit device according to a variation of the present embodiment. In the configuration of FIG. 6, not the GND electrode pad 313, but an electrode pad 321 adjacent to the ESD protection circuit 306 is used as the GND electrode pad. With this structure, the length of the connection line 311 which is connected to the source of the ESD protection circuit 306 can be shorter, compared to the structure shown in FIG. 5. As a result, the ESD protection resistance value can be reduced, and the allowable surge voltage is further increased.

In FIG. 6, the GND electrode pad 321 is located above the circuit block 31, but may be at any location as long as the electrode pad is adjacent to the ESD protection circuit 306, or at a location which overlaps with the ESD protection circuit 306.

In FIG. 5 and FIG. 6, the electrode pads 32 are arranged in a matrix, but do not necessarily have to be arranged in a perfect matrix. For example, some of the electrode pads may not be aligned or may be omitted.

Fourth Embodiment

Figure 7:
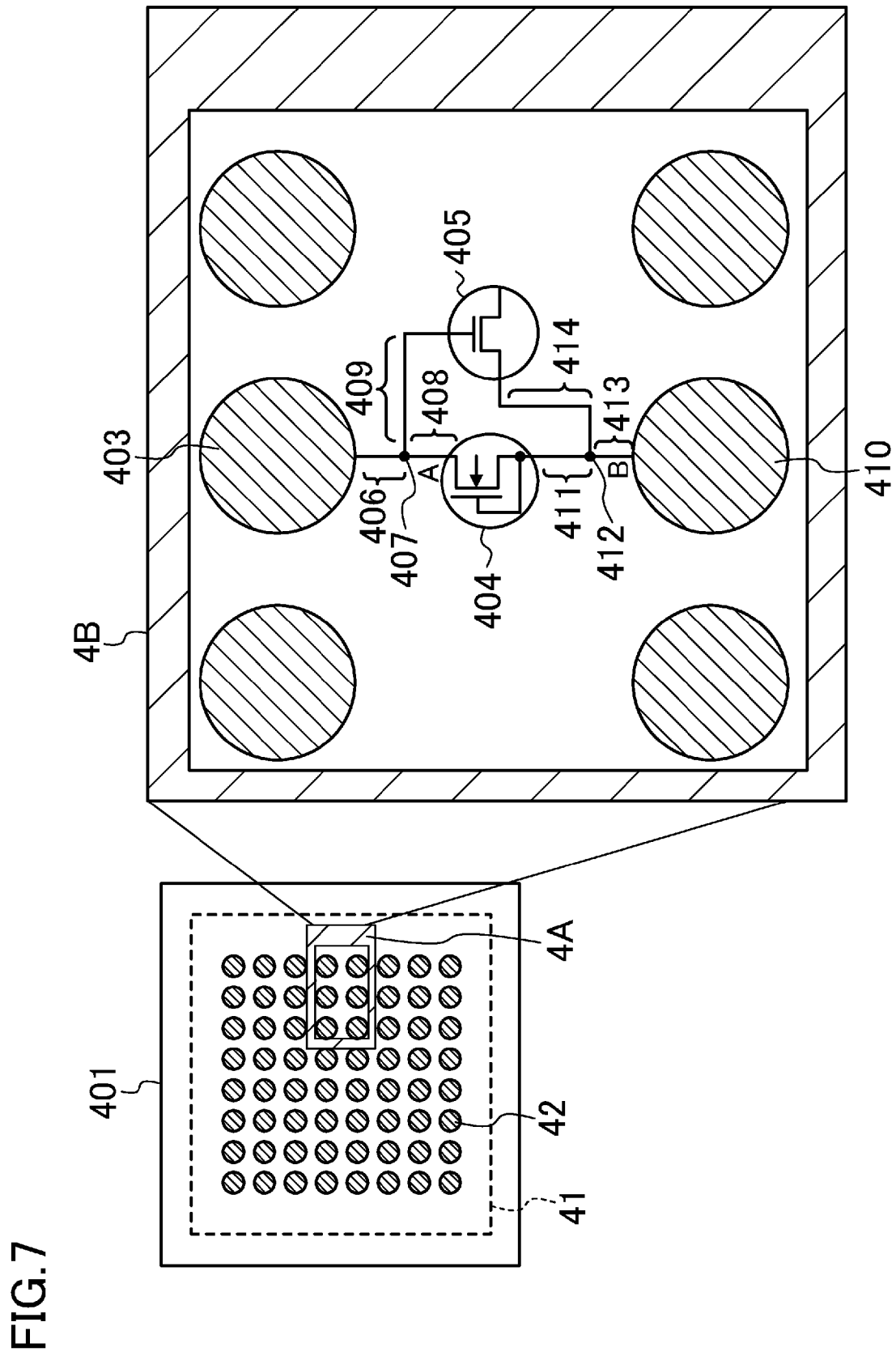
FIG. 7 shows a configuration of a semiconductor integrated circuit device according to the fourth embodiment.

FIG. 7 shows a configuration of a semiconductor integrated circuit device according to the fourth embodiment. In the semiconductor integrated circuit device 401 shown in FIG. 7, electrode pads 42 are arranged above the circuit block 41. The reference character 4B is an enlarged view of the area 4A. As shown in the enlarged view 4B, an ESD protection circuit 404 is positioned adjacent to an input circuit 405. A junction point A407 is provided on a connection line connecting an electrode pad 403 to the input circuit 405 and the ESD protection circuit 404. A junction point B412 is provided on a connection line connecting a GND electrode pad 410 to the input circuit 405 and the ESD protection circuit 404.

Specifically, the electrode pad 403 and a drain region of the ESD protection circuit 404 comprised of an N type MOS transistor are connected to each other by a line 406 as a first line connecting the electrode pad 403 and the junction point A407, and a line 408 as a third line connecting the junction point A407 and the ESD protection circuit 404. The GND electrode pad 410 and a source region of the ESD protection circuit 404 are connected to each other by a line 413 as a first line connecting the GND electrode pad 410 and the junction point B412, and a line 411 as a third line connecting the junction point B412 and the ESD protection circuit 404.

A gate of the input circuit 405 is connected to the electrode pad 403 by the line 406 connecting the electrode pad 403 and the junction point A407, and a line 409 as a second line connecting the junction point A407 and the input circuit 405. A source region of the input circuit 405 is connected to the GND electrode pad 410 by the line 413 connecting the GND electrode pad 410 and the junction point B412, and a line 414 as a second line connecting the junction point B412 and the input circuit 405.

The routing of the lines 411, 414 and the lines 408, 409 can be shortened by positioning the ESD protection circuit 404 at a location adjacent to the input circuit 405 as shown in FIG. 7. That is, both of the length from the electrode pad to the input circuit, and the length from the electrode pad to the ESD protection circuit are reduced, compared to the third embodiment. This means that it is possible to reduce not only the ESD protection resistance value, but also the resistance values of the lines connected to the input circuit. Also, less line resources are necessary.

As described above, according to the present embodiment, the first line connecting the electrode pad and the junction point, the second line connecting the junction point and the input circuit, and the third line connecting the junction point and the ESD protection circuit, are provided to position the ESD protection circuit at a location adjacent to the input circuit in the circuit block. With this structure, it is possible to reduce not only the ESD protection resistance value, but also the resistance values of the lines connected to the input circuit. Also, less line resources are necessary.

In the above embodiments, the junction points are provided at two locations (the junction point A and the junction point B) as examples, but the same advantages can be obtained even if one of the two junction points is provided.

In the above embodiments, the ESD protection circuit is comprised of an N type MOS transistor whose gate voltage is fixed to a ground voltage, but may be comprised of a P type MOS transistor. In this case, needless to say, the GND electrode pad serves as a power source electrode pad.

In the above embodiments, an input circuit comprised of a MOS transistor having a gate electrode to which a line from an external connection terminal is connected is shown as an example internal circuit to which the electrode pads are connected. The same advantages can be obtained even in the case where the input circuit is replaced with an output circuit comprised of a MOS transistor having a drain region to which the external connection terminal is connected, as the internal circuit to which the electrode pads are connected. Alternatively, an input/output circuit may be used as the internal circuit, instead of using an input circuit and an output circuit.

The same advantages can be obtained even in the case where the ESD protection circuit is comprised not of a MOS transistor, but of a diode, for example, or in the case where the internal circuit is comprised not of a MOS transistor, but of another element.

In the present disclosure, it is possible to prevent an internal circuit from being damaged by a surge voltage. Thus, the present disclosure is advantageous in terms of increasing, for example, durability of a semiconductor integrated circuit device.

What is claimed is:
1. A semiconductor integrated circuit device, comprising:
   a circuit block having an internal circuit which is an input circuit, an output circuit, or an input/output circuit;
   an electrode pad provided above the circuit block, and electrically connected to the internal circuit;
   a peripheral portion located outside of the circuit block and having an electrostatic discharge (ESD) protection circuit electrically connected to the electrode pad; and a connection line connecting the electrode pad to the internal circuit and the ESD protection circuit and having a junction point thereon, wherein:

the connection line includes a first line connecting the electrode pad and the junction point, a second line connecting the junction point and the internal circuit, and a third line connecting the junction point and the ESD protection circuit, the junction point is located between the ESD protection circuit and the electrode pad in a first axis along which the first line is extending in a plane view, the junction point is located between the ESD protection circuit and the internal circuit in the first axis in the plane view, the junction point is positioned at a location which is closer to the ESD protection circuit than to the electrode pad in the first axis in the plane view, the internal circuit is located farther from the ESD protection circuit than the junction point in the first axis, and the second line is provided in the circuit block and includes a line paralleled with the first line in the first axis.

2. The semiconductor integrated circuit device of claim 1, wherein a resistance value of the third line is smaller than a resistance value of the second line.

3. The semiconductor integrated circuit device of claim 1, wherein the second line is longer than the third line.

4. The semiconductor integrated circuit device of claim 1, wherein the electrode pad connected to the ESD protection circuit is an outermost one of electrode pads provided above the circuit block.

5. The semiconductor integrated circuit device of claim 1, wherein the second line is connected to a gate of a transistor included in the internal circuit.

6. The semiconductor integrated circuit device of claim 1, wherein the second line is connected to one of a source and a drain of a transistor included in the internal circuit.

* * * * *